United States Patent
Lu et al.

(10) Patent No.: US 10,290,723 B2
(45) Date of Patent: May 14, 2019

(54) SEMICONDUCTOR DEVICE WITH METAL GATE

(71) Applicant: UNITED MICROELECTRONICS CORP., Hsin-Chu (TW)

(72) Inventors: Chun-Tsen Lu, Tainan (TW); Chien-Ming Lai, Tainan (TW); Lu-Sheng Chou, Kaohsiung (TW); Ya-Huei Tsai, Tainan (TW); Ching-Hsiang Chiu, Yilan County (TW); Yu-Tung Hsiao, Tainan (TW); Chen-Ming Huang, Taipei (TW); Kun-Ju Li, Tainan (TW); Yu-Ping Wang, Taoyuan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/981,913

(22) Filed: May 17, 2018

(65) Prior Publication Data
US 2018/0269308 A1 Sep. 20, 2018

Related U.S. Application Data

(63) Continuation of application No. 14/840,041, filed on Aug. 30, 2015, now Pat. No. 10,008,581.

(30) Foreign Application Priority Data

Aug. 3, 2015 (CN) .......................... 2015 1 0467637

(51) Int. Cl.
*H01L 29/51* (2006.01)
*H01L 29/66* (2006.01)
*H01L 29/423* (2006.01)
*H01L 29/49* (2006.01)
*C22C 32/00* (2006.01)
*H01L 21/28* (2006.01)
*B32B 1/00* (2006.01)
*B32B 18/00* (2006.01)

(52) U.S. Cl.
CPC .......... *H01L 29/66545* (2013.01); *B32B 1/00* (2013.01); *B32B 18/00* (2013.01); *C22C 32/0068* (2013.01); *H01L 21/28088* (2013.01); *H01L 29/4238* (2013.01); *H01L 29/4966* (2013.01); *H01L 29/511* (2013.01)

(58) Field of Classification Search
None
See application file for complete search history.

(56) References Cited

U.S. PATENT DOCUMENTS

| | | |
|---|---|---|
| 7,074,680 B2 | 7/2006 | Doczy et al. |
| 8,652,890 B2 | 2/2014 | Schmidbauer |
| 8,766,379 B2 | 7/2014 | Liu et al. |

(Continued)

*Primary Examiner* — Benjamin P Sandvik
(74) *Attorney, Agent, or Firm* — Winston Hsu

(57) ABSTRACT

A semiconductor device includes a substrate and a gate structure on the substrate, in which the gate structure includes a high-k dielectric layer on the substrate and a bottom barrier metal (BBM) layer on the high-k dielectric layer. Preferably, the BBM layer includes a top portion, a middle portion, and a bottom portion, the middle portion being a nitrogen rich portion, the top portion and the bottom portion being titanium rich portions, and the top portion, the middle portion, and the bottom portion are of same material composition.

7 Claims, 2 Drawing Sheets

(56) References Cited

U.S. PATENT DOCUMENTS

| | | |
|---|---|---|
| 9,755,039 B2 | 9/2017 | Tsau |
| 2011/0241130 A1 | 10/2011 | Chan |
| 2015/0061041 A1 | 3/2015 | Lin |
| 2015/0206963 A1* | 7/2015 | Ho .................... H01L 21/31111 257/411 |

* cited by examiner

SEMICONDUCTOR DEVICE WITH METAL GATE

CROSS REFERENCE TO RELATED APPLICATIONS

This is a continuation application of U.S. patent application Ser. No. 14/840,041, filed on Aug. 30, 2015, and all benefits of such earlier application are hereby claimed for this new continuation application.

BACKGROUND OF THE INVENTION

1. Field of the Invention

The invention relates to a semiconductor device, and more particularly to a semiconductor device with metal gate.

2. Description of the Prior Art

In current semiconductor industry, polysilicon has been widely used as a gap-filling material for fabricating gate electrode of metal-oxide-semiconductor (MOS) transistors. However, the conventional polysilicon gate also faced problems such as inferior performance due to boron penetration and unavoidable depletion effect which increases equivalent thickness of gate dielectric layer, reduces gate capacitance, and worsens driving force of the devices. In replacing polysilicon gates, work function metals have been developed to serve as a control electrode working in conjunction with high-K gate dielectric layers.

Typically, threshold voltage in conventional planar metal gate transistors is adjusted by the means of ion implantation. With the trend in the industry being towards scaling down the size of the metal oxide semiconductor transistors (MOS), three-dimensional or non-planar transistor technology, such as fin field effect transistor technology (FinFET) has been developed to replace planar MOS transistors. Nevertheless, when electrical field applied onto a dielectric material exceeds a threshold value, a sudden increase in the electrical current passing through the dielectric material would easily induce a time-dependent dielectric breakdown (TDDB) issue. Hence, how to resolve this issue in today's FinFET architecture has become an important task in this field.

SUMMARY OF THE INVENTION

According to an embodiment of the present invention, a semiconductor device includes a substrate and a gate structure on the substrate, in which the gate structure includes a high-k dielectric layer on the substrate and a bottom barrier metal (BBM) layer on the high-k dielectric layer. Preferably, the BBM layer includes a top portion, a middle portion, and a bottom portion, the middle portion being a nitrogen rich portion, the top portion and the bottom portion being titanium rich portions, and the top portion, the middle portion, and the bottom portion are of same material composition.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
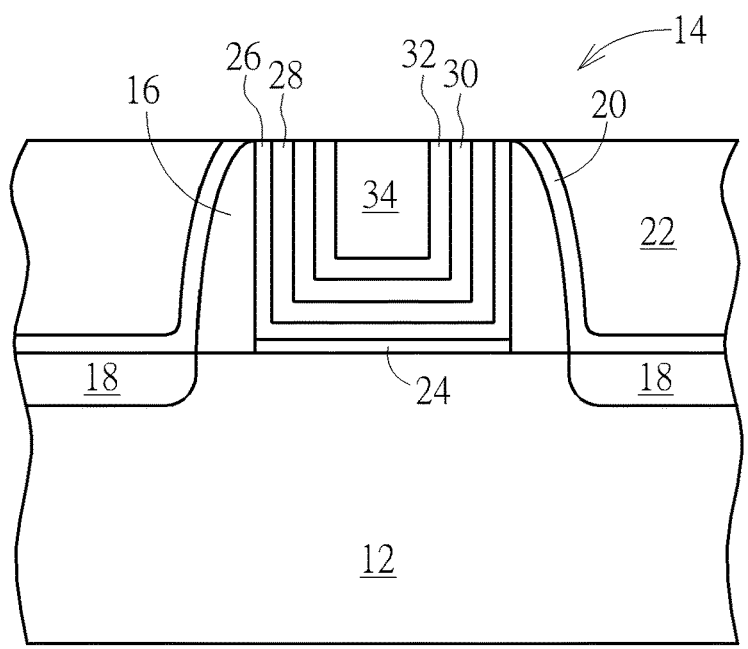
FIG. 1 illustrates a method for fabricating semiconductor device according to a preferred embodiment of the present invention.

Referring to FIG. 1, FIG. 1 illustrates a method for fabricating semiconductor device according to a preferred embodiment of the present invention. As shown in FIG. 1, a substrate 12 is first provided, and a gate structure 14 is formed on the substrate 12. The substrate 12 could be a silicon substrate, a silicon-containing substrate (such as SiC substrate), a GaN substrate, a GaN-on-silicon substrate, a graphene-on-silicon substrate, a SOI substrate or a substrate containing epitaxial layer (such as a p-type substrate containing p-type epitaxial layer with 2.5 µm thickness).

The fabrication of the gate structure 14 could be accomplished by a gate first process, a high-k first approach from gate last process, or a high-k last approach from gate last process. Since this embodiment pertains to a high-k last approach, a dummy gate (not shown) composed of interfacial layer and polysilicon material could be first formed on the substrate 12, and a spacer 16 is formed on the sidewall of the dummy gate. A source/drain region 18 and/or epitaxial layer (not shown) are then formed in the substrate 12 adjacent to two sides of the spacer 16, a silicide layer (not shown) could be selectively formed on the source/drain region 26 and/or epitaxial layer, a contact etch stop layer (CESL) 20 is formed on the dummy gate, and an interlayer dielectric (ILD) layer 22 composed of material such as tetraethyl orthosilicate (TEOS) is formed on the CESL 20.

Next, a replacement metal gate (RMG) process could be conducted to first planarize part of the ILD layer 22 and CESL 20 and then transform the dummy gate into the gate structure 14 composed of metal gate. The RMG process could be accomplished by first performing a selective dry etching or wet etching process, such as using etchants including ammonium hydroxide ($NH_4OH$) or tetramethyl-ammonium hydroxide (TMAH) to remove the polysilicon material from dummy gate for forming a recess (not shown) in the ILD layer 22 and spacer 16.

Next, the interfacial layer in the dummy gate could be removed, and another interfacial layer 24, a high-k dielectric layer 26, a bottom barrier metal (BBM) layer 28, a BBM layer 30, a work function metal layer 32, and a low resistance metal layer 34 are deposited into the recess. A planarizing process, such as CMP process is then conducted so that the top surfaces of the high-k dielectric layer 26, BBM layer 28, BBM layer 30, work function metal layer 32, and low resistance metal layer 34 are coplanar. Since this embodiment pertains to a high-k last process, the cross-sections of the high-k dielectric layer 26, BBM layer 28, BBM layer 30, and work function layer 32 are U-shaped. If a high-k first approach were employed to transform the dummy gate into a metal gate, the cross-section of the high-k dielectric layer 26 is preferably I-shaped while the cross-sections of the BBM layer 28, BBM layer 30, and work function metal layer 32 are U-shaped, which is also within the scope of the present invention.

In this embodiment, the interfacial layer 24 is preferably composed of oxides such as $SiO_2$, SiN, or SiON, but could also be composed of high-k dielectric material. The BBM layer 28 is preferably composed of TiN and the BBM layer 30 is composed of TaN, but not limited thereto.

The high-k dielectric layer 26 is preferably selected from dielectric materials having dielectric constant (k value) larger than 4. For instance, the high-k dielectric layer 26 may be selected from hafnium oxide (HfO$_2$), hafnium silicon oxide (HfSiO$_4$), hafnium silicon oxynitride (HfSiON), aluminum oxide (Al$_2$O$_3$), lanthanum oxide (La$_2$O$_3$), tantalum oxide (Ta$_2$O$_5$), yttrium oxide (Y$_2$O$_3$), zirconium oxide (ZrO$_2$), strontium titanate oxide (SrTiO$_3$), zirconium silicon oxide (ZrSiO$_4$), hafnium zirconium oxide (HfZrO$_4$), strontium bismuth tantalate (SrBi$_2$Ta$_2$O$_9$, SBT), lead zirconate titanate (PbZr$_x$Ti$_{1-x}$O$_3$, PZT), barium strontium titanate (Ba$_x$Sr$_{1-x}$TiO$_3$, BST) or a combination thereof.

In this embodiment, the work function metal layer 32 is formed for tuning the work function of the later formed metal gates to be appropriate in an NMOS or a PMOS. For an NMOS transistor, the work function metal layer 32 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 32 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 32 and the low resistance metal layer 34, in which the material of the barrier layer may include titanium (Ti), titanium nitride (TiN), tantalum (Ta) or tantalum nitride (TaN). Furthermore, the material of the low-resistance metal layer 34 may include copper (Cu), aluminum (Al), titanium aluminum (TiAl), cobalt tungsten phosphide (CoWP) or any combination thereof. Since the process of using RMG process to transform dummy gate into metal gate is well known to those skilled in the art, the details of which are not explained herein for the sake of brevity.

Figure 2:
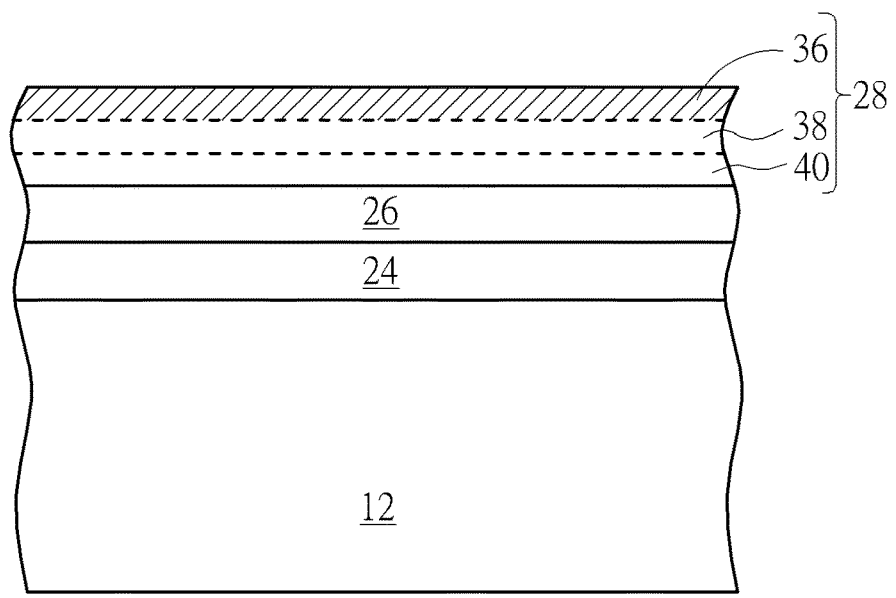
FIG. 2 illustrates an enlarged view of the BBM layer shown in FIG. 1.

It should be noted that the nitrogen and titanium ratio of the BBM layer 28 is adjusted during the deposition of the BBM layer 28 so that different parts of the BBM layer 28 could have different nitrogen to titanium ratio. Referring to FIG. 2, FIG. 2 illustrates an enlarged view of the BBM layer 28 of FIG. 1. As shown in FIG. 2, the BBM layer 28 could be composed of a top portion 36, a middle portion 38, and a bottom portion 40, in which the thickness of each of the top portion 36, middle portion 38, and bottom portion 40 is one third of the thickness of the entire BBM layer 38. In addition, the top portion 36 is a nitrogen rich portion while each of the middle portion 38 and the bottom portion 40 is a titanium rich portion. If viewing from the nitrogen to titanium ratio perspective, the nitrogen-to-titanium ratio in the top portion 36 is 1-1.2 to 1, the nitrogen-to-titanium ratio in the middle portion 38 is 0.5-1 to 1, and the nitrogen-to-titanium ratio in the bottom portion 40 is 0.5-1 to 1. In other words, the top portion 36 of BBM layer 28 in this embodiment preferably includes higher nitrogen atom content while the middle portion 38 and bottom portion 40 include higher titanium atom content.

Figure 3:
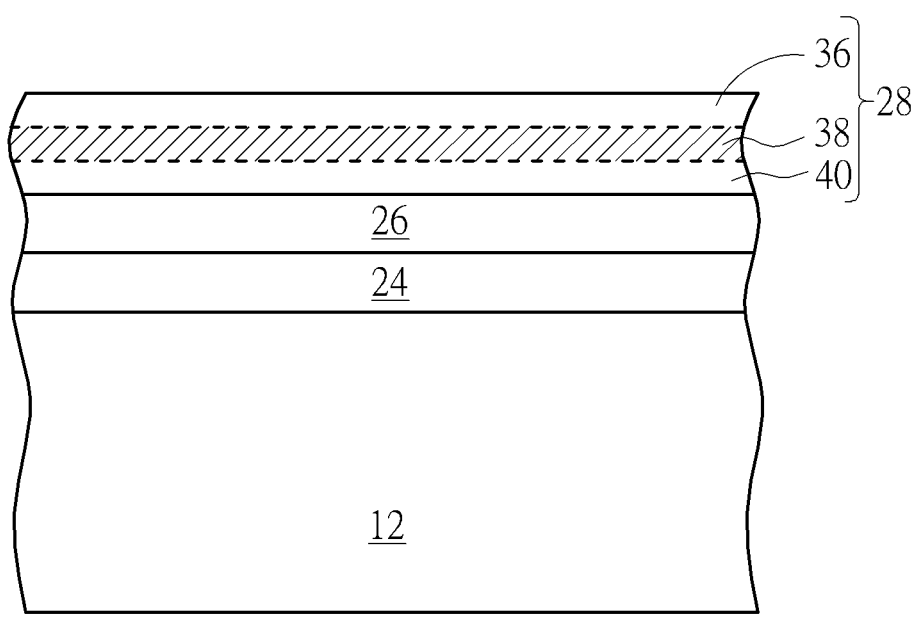
FIG. 3 illustrates a structural view of a semiconductor device according to another embodiment of the present invention.

Referring to FIG. 3, FIG. 3 illustrates a structural view of the BBM layer 28 of a semiconductor device according to another embodiment of the present invention. Similar to the aforementioned embodiment shown in FIG. 2, the BBM layer 28 is also divided into a top portion 36, a middle portion 38, and a bottom portion 40, in which the thickness of each of the top portion 36, middle portion 38, and bottom portion 40 is one third of the total thickness of the BBM layer 28. In this embodiment, the middle portion 38 is a nitrogen rich portion while each of the top portion 36 and the bottom portion 40 is a titanium rich portion. If viewing from the nitrogen to titanium ratio perspective, the nitrogen-to-titanium ratio in the middle portion 38 is 1-1.2 to 1, the nitrogen-to-titanium ratio in the top portion 36 is 0.5-1 to 1, and the nitrogen-to-titanium ratio in the bottom portion 40 is 0.5-1 to 1. In other words, the middle portion 38 of BBM layer 28 in this embodiment preferably includes higher nitrogen atom content while the top portion 36 and bottom portion 40 include higher titanium atom content.

Overall, the present invention provides two metal gate transistor structures, in which the BBM layer composed of TiN in the metal gate preferably includes a top portion, a middle portion, and a bottom portion. According to a first embodiment of the present invention, the top portion of the BBM layer is a nitrogen rich portion while each of the middle portion and bottom portion is a titanium rich portion. According to a second embodiment of the present invention, the middle portion of the BBM layer is a nitrogen rich portion while each of the top portion and bottom portion is a titanium rich portion. By employing the aforementioned metal gate transistor structures, it would be desirable to resolve the TDDB issue commonly found in current metal gate transistors.

It should be noted that even though the aforementioned embodiment pertains to the BBM layer 28 consisting of TiN having multiple portions while BBM layer 30 consisting of TaN having only a single portion, it would also be desirable to follow the aforementioned embodiment to adjust the nitrogen to tantalum ratio in the BBM layer 30 so that the BBM layer 30 could be divided into a top portion, a middle portion, and a bottom portion, in which each of the top portion, middle portion, and bottom portion could either be a nitrogen rich portion or a tantalum rich portion. For instance, it would be desirable to adjust the top portion of the BBM layer 30 to be a nitrogen rich portion while the middle portion and bottom portion being tantalum rich portions, or adjust the middle portion of the BBM layer 30 to be a nitrogen rich portion while the top portion and bottom portion being tantalum rich portions, or adjust the bottom portion of the BBM layer 30 to be a nitrogen rich portion while the top portion and middle portion being tantalum rich portions, which are all within the scope of the present invention.

Moreover, despite the aforementioned embodiment pertains to a planar type transistor, it would also be desirable to employ the semiconductor device of the present invention to non-planar transistors, such as Fin-FET devices and in such instance, the substrate 12 shown in FIGS. 1-3 would correspond to a fin-shaped structure atop a substrate, which is also within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor device, comprising:
a substrate; and
a gate structure on the substrate, wherein the gate structure comprises:
   a high-k dielectric layer on the substrate;
   a first bottom barrier metal (BBM) layer on the high-k dielectric layer, wherein the first BBM layer comprises a top portion, a middle portion, and a bottom portion, the middle portion being a nitrogen rich portion, the top portion and the bottom portion being titanium rich portions, and the top portion, the middle portion, and the bottom portion are of same material composition;
a second BBM layer directly on the first BBM layer, wherein the first BBM layer and the second BBM layer comprise different materials; and
a work function metal layer on the second BBM layer, wherein the second BBM layer contacts the work function metal layer directly.

2. The semiconductor device of claim 1, wherein the thickness of the top portion is one third of the thickness of the BBM layer.

3. The semiconductor device of claim 1, wherein the thickness of the middle portion is one third of the thickness of the BBM layer.

4. The semiconductor device of claim 1, wherein the thickness of the bottom portion is one third of the thickness of the BBM layer.

5. The semiconductor device of claim 1, wherein the nitrogen-to-titanium ratio of the middle portion is 1:1.2 to 1:1.

6. The semiconductor device of claim 1, wherein the nitrogen-to-titanium ratio in the top portion is 0.5:1 to 1:1.

7. The semiconductor device of claim 1, wherein the nitrogen-to-titanium ratio in the bottom portion is 0.5:1 to 1:1.

* * * * *